United States Patent [19]

Heinke et al.

[11] 4,042,419
[45] Aug. 16, 1977

[54] PROCESS FOR THE REMOVAL OF SPECIFIC CRYSTAL STRUCTURE DEFECTS FROM SEMICONDUCTOR DISCS AND THE PRODUCT THEREOF

[75] Inventors: Wolfgang Heinke, Mehring-Oed; Helmut Kirschner, Burghausen; Detlef Reimann, Engelsberg, all of Germany

[73] Assignee: Wacker-Chemitronic Gesellschaft fur Elektronik-Grundstoffe mbH, Burghausen, Germany

[21] Appl. No.: 708,235

[22] Filed: July 23, 1976

[30] Foreign Application Priority Data

Aug. 22, 1975 Germany .............................. 2537464

[51] Int. Cl.² .................. H01L 21/322; H01L 21/324
[52] U.S. Cl. ...................................... 148/1.5; 148/33; 148/187
[58] Field of Search .................................. 148/1.5, 187

[56] References Cited

U.S. PATENT DOCUMENTS

| 3,701,696 | 10/1972 | Mets ...................................... 148/175 |
| 3,830,668 | 8/1974 | Dearnaley et al. ................... 148/1.5 |
| 3,929,529 | 12/1975 | Poponiak .......................... 148/187 X |
| 3,933,530 | 1/1976 | Mueller et al. ........................ 148/1.5 |
| 3,997,368 | 12/1976 | Petroff et al. ......................... 148/1.5 |

*Primary Examiner* — G. Ozaki
*Attorney, Agent, or Firm* — Allison C. Collard

[57] ABSTRACT

Process of the removal of point defects and point defect agglomerates from semiconductor discs, which comprises the steps of providing one side of the discs with a mechanical stress field and then subjecting the discs to a heat treatment.

7 Claims, No Drawings

PROCESS FOR THE REMOVAL OF SPECIFIC CRYSTAL STRUCTURE DEFECTS FROM SEMICONDUCTOR DISCS AND THE PRODUCT THEREOF

The invention relates to a process for the removal of point defects and point defect agglomerates from semiconductor discs.

In the production of electronic components or structural parts, especially with unipolar structures, where, in contrast to bipolar transistors, only one type of charge carrier plays a part, point defects, such as, for example, empty spots or interstitial atoms promote the formation of leakage currents which have a negative influence on the regeneration time (refreshment time), i.e., the period of time in which a structural part of this type must be reactuated.

It is therefore, the object of the invention to remove point defects and point defect agglomerates from semiconductor discs as used for the production of structural parts of this type.

This object is accomplished according to the invention by providing one side of the semiconductor discs with a mechanical stress field and then subjecting them to heat treatment.

A mechanical stress field of this type may be produced on the semiconductor disc, for example, by inserting a doping material in the surface of the disc and in a quantity which exceeds the maximum solubility in the crystal lattice of the semiconductor disc, the maximum solubility being taken as the exact amount of foreign atoms which the lattice can absorb before it collapses. The prerequisite for this is that the foreign atoms differ in size from the lattice atoms of the semiconductor disc. If the semiconductor disc were made of silicon, for example, a suitable doping material would be, for example, an element of the Main Group V, such as phosphorus or antimony, or also elements of the Main Group III, such as boron in particular, but also aluminum, gallium or indium.

The semiconductor discs cut or sawn, and optionally etched or polished, from cast, zone drawn or, especially, cruicible-drawn semiconductor material are exposed to a gas stream in this process in a conventional diffusion oven at a high temperature, which depends both on the semiconductor material and on the chosen doping substance, and if desired on the doping substance compound as well. Where, for example, silicon is the semiconductor material, and phsophorus is the doping substance, the gas stream contains the doping substance or the doping substance compound, in most cases mixed with oxygen and/or an inert gas such as, for example, neon, krypton, xenon or especially argon, and is heated to about 1000° to 1200° C, 10 to 20 minutes generally being sufficient. After the gas mixture has acted on the semiconductor discs, the latter are chilled to a considerably lower temperature, e.g., room temperature, by rapidly removing them from the high temperature zone. However, at this considerably lower temperature, the maximum solubility of the doping substance in the host lattice of the semiconductor disc is exceeded. The host lattic compensates for stresses caused as a result of this by forming mismatching dislocations. Since the processes described in brief take place only in the area near the surface of the semiconductor disc to a depth of about 1 to 5 u, in most cases even only to a depth of 1 to 2 u, this thin layer permeated by foreign atoms and mismatching dislocations, wich was orginally formed on both sides of the disc, can easiy be removed again from one side by subsequently polishing one surface of the disc, the dislocation network then remaining on one side of the disc only.

The production of a defined surface destruction of one side of a disc has been particularly successful as a preferred manner of producing a mechanical stress field on the semiconductor disc. It is important that only a portion of the surface of the side of a disc is destroyed, about 0.01 to 50% — although 0.1 to 1.5% is usually sufficient - and for best results statistically over the entire surface of the side of a disc. The quantitative extent of destruction is generally difficult to estimate since healing processes occur even during destruction. The exact quantitative determination is, however, insignificant, since even slight destruction brings about the desired effect which is to establish a mechanical stress field in one surface of a disc.

This partial destruction of the semiconductor surface whih is again to take effect only up to a depth of a few microns, may be brought about, for example, by briefly grinding the surface of a disc with an abrasive, the solid components of which are harder than the semiconductor material to be treated. Suitable grinding abrasives are, for example, aluminum oxide, diamond dust, zirconium oxide, quartz, silicates, fluosilicates or silicon carbide with an average particle size of about 5 to 200 mu, suspended in a liquid such as, for example, water, glycerine, alcohol, linseed oil, petroleum or mixtures of the same. The simplest manner to effect the grinding is on a polishing machine generally used for polishing semiconductor discs. Especially suitable polishing cloths are soft films, available on the market, made of polyurethane, polyamide, polyester, or polyvinyl chloride.

The processing time, i.e., the duration of grinding, is very brief, about 1 to 8 minutes, and usually depends on the chosen abrasive, bearing pressure, and the speed at which the polishing plate revolves. This surface of the disc may only be processed on one side for a short time because normally only a very small portion of the surface is to be destroyed. If the entire surface of the disc were lapped — even if only on one side — this would not bring about the good results for the purpose of the invention. The normal speeds of the polishing semiconductor discs will be advantageous, as will polishing semiconductor discs will be advantageous, as will a bearing pressure in the range of about $10^{-3}$ to 10 kp/cm$^2$, preferably between $5 - 10^{-2}$ to 1 kp/cm$^2$.

If a stress field was produced on one side of the semiconductor surface according to one of these two processes — or to a third process according to one of these two processes — or to a third process according to the invention — the point defects would be removed by suction in a subsequent step by an annealing process at a temperature of about 800 to 1,200° C especially when silicon is used as the semiconductor material. The point defects in the form of empty spots or interstitial atoms in particular, are mobile at high temperature and are sucked out of the semiconductor disc by the stress field on one side. The field is brought about by the unilateral dislocation network, formed as a result of foreign doping, or the surface destruction. The process is extremely temperature-dependent and can last 1 minute to 8 hours, but in most cases 30 minutes to 3 hours are sufficient.

Instead of a pure annealing process in vacuo or under inert gas, it is often recommended to carry out thermal oxidation as well, in the same temperature range, and preferably in an atmosphere which is moist and contains oxygen, such as, for example, highly-purified air, oxygen or noble gas/oxygen mixtures. Such an oxidation of the semiconductor disc would in any case have to be effected during further processing when for example, insulating layer-field effect transistors, abbreviated form MOSFET (metal-oxide-semiconductor) are produced. Between 1 minute and 20 hours are necessary for this oxidation process since it is likewise extremely temperature-dependent, but generally 1 to 5 hours are sufficient in this case too. Afterwards, both in the case of pure annealing and oxidation, cooling is slowly effected until room temperature is reached.

It is also possible to carry out the two steps, i.e., production of a mechanical stress field and subsequent heat treatment, at different times, i.e., to carry out the second step only during further processing of these prepared semiconductor discs provided with a stress field into MOS structural parts since this step, as already mentioned, is in any case indispensable.

The process is preferably used when removing point defects and point defect agglomerates from crucible-drawn silicon in particular. However, in principle it can also be applied with other semiconductor material such as, for example germanium or III/V compounds such as gallium arsenide or gallium phosphate irrespective of the method of production.

In the following, a number of examples are given but it should be understood that they are presented only as illustration and not as limitation.

EXAMPLE 1

Silicon discs about 400 $\mu$ thick, sawn and etched from a monocrystalline silicon rod 7.5 cm thick grown according to a modified Czochralsky crucible-drawing process, said discs containing points defects, were exposed to a gas mixture of argon, oxygen and antimony trichloride at a temperature of about 1,050° C. in a diffusion oven. After 15 minutes, the discs were subjected to a temperature shock by rapidly removing them from the oven. Afterwards, one side of the silicon discs was polished, i.e., a surface layer of about 5 $\mu$ was removed from one side. The silicon discs pre-treated in this manner were then kept at a temperature of 950° C. under argon at normal pressure in an annealing oven for approximately one hour and then slowly cooled to room temperature within 10 minutes. A test disc was then etched with an acid mixture and examined under a microscope. No more point defects or point defect agglomerates could be detected.

EXAMPLE 2

Silicon discs corresponding to Example 1 were treated for 3 minutes on a conventional polishing machine with aluminum oxide suspended in a water/glycerine mixture. The bearing pressure was $5 \times 10^{-2}$, the speed of the soft polishing cloth was 90 rmp while the polishing suspension was added dropwise at a speed of 3 ml per minute and per discs. The discs were then rinsed with water and exposed to a mixture of oxygen and argon for 2 hours in an oven at 1,000° C. Afterwards the discs were again cooled to room temperature within a period of 10 minutes. The oxide formed on the discs was removed with hydrofluoric acid in the case of a test disc. After etching with a specific acid mixture the disc was then examined under a microscope for point defects. The disc proved flawless.

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and intended to be, within the full range of equivalence of the following claims.

What is claimed is:

1. A process for the removal of point defects and point defect agglomerates from semiconductor discs, comprising the steps of providing one side of the semiconductor discs with a mechanical stress field and then subjecting the discs to a heat treatment.

2. The process according to claim 1 wherein the mechanical stress field is produced by super-saturating the crystal lattice in the surface of the semiconductor disc with foreign atoms which differ in size from the lattice atoms of the semiconductor disc.

3. The process according to claim 1 wherein the mechanical stress field is formed by bringing about a defined surface destruction.

4. The process according to claim 3 wherein the defined surface destruction is brought about by briefly grinding one side of the disc with an abrasive, the solids of which are harder than the semiconductor material treated.

5. The process according to claim 1 wherein the subsequent heat treatment is carried out in an atmosphere containing oxygen.

6. The process according to claim 1 wherein the semiconductor disc is made of silicon.

7. A semiconductor disc free of point defects and point defect agglomerates when made by the process defined in claim 1.

* * * * *